(12) United States Patent
Wits et al.

(10) Patent No.: US 8,305,762 B2
(45) Date of Patent: Nov. 6, 2012

(54) PLANAR HEAT PIPE FOR COOLING

(75) Inventors: Wessel Willems Wits, GN Zwolle (NL);
Jan Hendrik Mannak, SE Apeldoorn
(NL); Rob Legtenberg, HC Hengelo
(NL)

(73) Assignee: Thales Nederland B.V., GD Hengelo (NL)

( * ) Notice: Subject to any disclaimer, the term of this patent is extended or adjusted under 35 U.S.C. 154(b) by 1028 days.

(21) Appl. No.: 12/278,377

(22) PCT Filed: Feb. 16, 2007

(86) PCT No.: PCT/EP2007/051533
§ 371 (c)(1),
(2), (4) Date: Oct. 23, 2008

(87) PCT Pub. No.: WO2007/096313
PCT Pub. Date: Aug. 30, 2007

(65) Prior Publication Data
US 2009/0065180 A1  Mar. 12, 2009

(30) Foreign Application Priority Data

Feb. 22, 2006 (NL) ................................. 1031206

(51) Int. Cl.
*H05K 7/20* (2006.01)
(52) U.S. Cl. ........ 361/720; 361/689; 361/702; 361/708; 165/104.26; 257/717; 713/155
(58) Field of Classification Search .................. 361/689, 361/697–716, 720
See application file for complete search history.

(56) References Cited

U.S. PATENT DOCUMENTS

| 5,560,423 | A  | * | 10/1996 | Larson et al. ............ 165/104.26 |
| 6,082,443 | A  | * | 7/2000  | Yamamoto et al. ....... 165/104.26 |
| 6,490,159 | B1 | * | 12/2002 | Goenka et al. ................. 361/700 |
| 6,827,134 | B1 | * | 12/2004 | Rightley et al. .......... 165/104.26 |
| 6,901,994 | B1 | * | 6/2005  | Jin-Cherng et al. ..... 165/104.26 |
| 7,013,958 | B2 | * | 3/2006  | Garner et al. ............ 165/104.26 |
| 7,100,680 | B2 | * | 9/2006  | Dussinger et al. ........ 165/104.26 |
| 7,602,610 | B2 | * | 10/2009 | Ueda ............................... 361/701 |
| 7,730,605 | B2 | * | 6/2010  | Yeh et al. ......................... 29/611 |
| 2003/0159806 | A1 | * | 8/2003  | Sehmbey et al. ............ 165/80.3 |
| 2004/0069460 | A1 | * | 4/2004  | Sasaki et al. ............. 165/104.26 |
| 2004/0069462 | A1 | * | 4/2004  | Hashimoto ............... 165/104.26 |
| 2004/0252502 | A1 | * | 12/2004 | McCullough et al. ........ 362/241 |
| 2006/0005952 | A1 |   | 1/2006  | Yeh et al. |
| 2006/0096740 | A1 | * | 5/2006  | Zheng ...................... 165/104.26 |
| 2007/0125522 | A1 | * | 6/2007  | Stefanoski ............... 165/104.21 |

FOREIGN PATENT DOCUMENTS

DE  19818839  10/1999

(Continued)

*Primary Examiner* — Courtney Smith
(74) *Attorney, Agent, or Firm* — Stroock & Stroock & Lavan LLP

(57) ABSTRACT

There is disclosed an apparatus of planar heat pipe for cooling, which may be embedded in a printed circuit board for cooling of heat-dissipating components.
The apparatus includes two panels that are both metal clad on one side, at least one of the panels being grooved on its metal clad side, the panels being assembled by their metal clad sides to form a sealed cavity, the cavity being filled with a fluid, the fluid circulating by capillary action along the grooves towards zones exposed to heat where it vaporizes.
Application: electronics, cooling, printed circuit boards

12 Claims, 2 Drawing Sheets

FOREIGN PATENT DOCUMENTS

Figure 1:
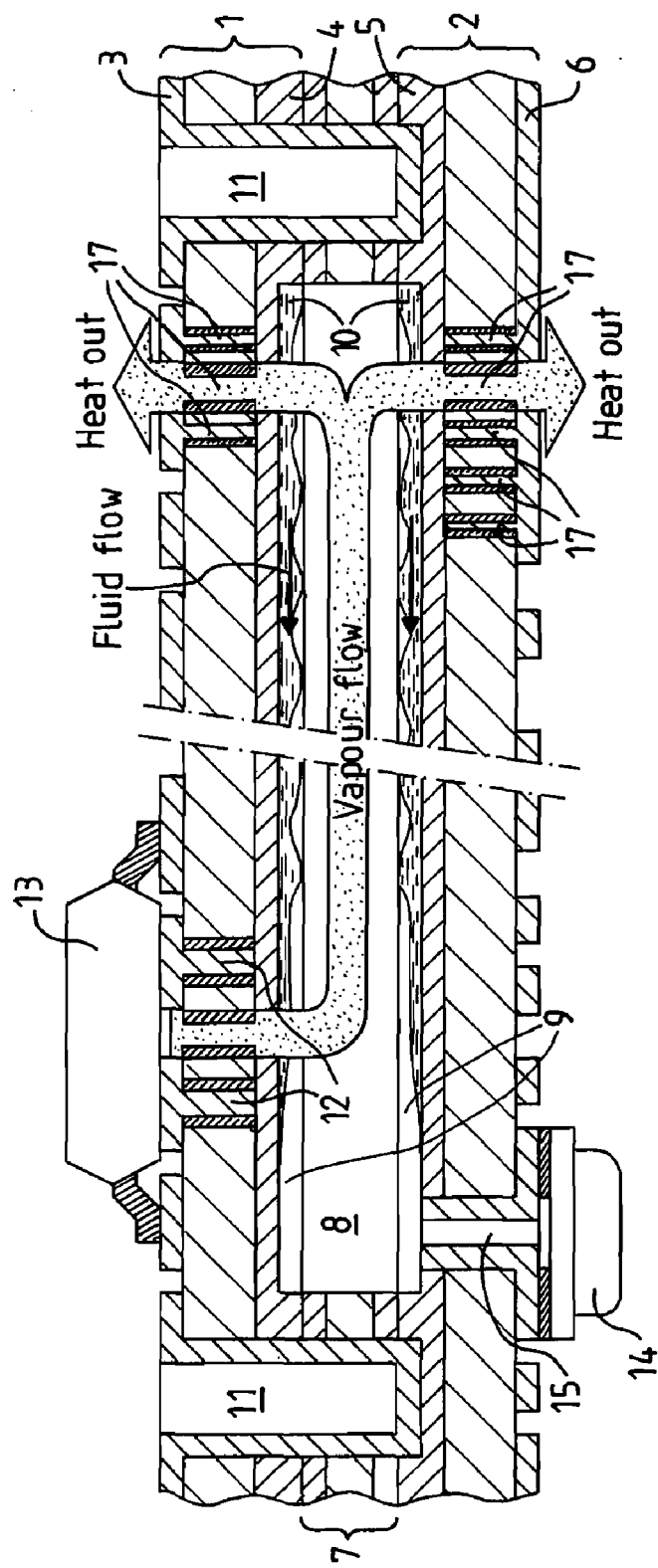

| | | |
|---|---|---|
| EP | 1363481 | 11/2003 |
| GB | 1484831 | 9/1977 |
| JP | 2001091172 | 4/2001 |
| SU | 465527 | 6/1975 |
| WO | 00/70288 | 11/2000 |

* cited by examiner

PLANAR HEAT PIPE FOR COOLING

CROSS-REFERENCE TO PRIOR APPLICATION

This is a U.S. National Phase application under 35 U.S.C. §371 of International Application No. PCT/EP2007/051533, filed on Feb. 16, 2007, and claims benefit of Dutch Patent Application No. 1031206, filed Feb. 22, 2006, both of which are incorporated herein. The International Application was published in English on Aug. 3, 2007 as WO 2007/096313.

The present invention relates to an apparatus of planar heat pipe for cooling. It is applicable to, but not just limited to electronic devices, for example by embedding the planar heat pipe into a printed circuit board for inherent cooling of heat-dissipating components.

As functionality and performance of semi-conductors continuously increase, so is the amount of dissipated heat per unit of their surface area. To control the rising temperature of printed circuit boards, referred to as PCB in the following description, a continuous improvement in cooling performance is required, especially for high-density multi-layered PCB assemblies featuring a high concentration of electronic components in small volumes.

Heat pipes are able to deliver that high performance in a relatively small form factor and in a fully passive mode, that is without a power source. Traditional heat pipes are cylindrical, tubular sealed structures containing a fluid and capillary grooves or pores on their inner surface. The heat dissipated by an external source such as electronic components warms up the fluid on one end of the pipe, where it vaporizes. Vapour flows towards the other end of the pipe by pressure gradient effect where it cools down and condenses, dissipating heat out of the structure. Condensed fluid circulates back along the inner surface, lined with grooves or pores, towards the heated end by capillary action. A PCB assembly equipped with such a heat pipe based cooling system provides a high level of performance. The heat pipe is approximately 3 times lighter than a solid copper structure with equivalent dimensions and has approximately 3 times better thermal conductivity. For example, this kind of heat pipe assembly is used in laptop computers to cool the CPU.

However, integration of tubular heat pipes into PCB assemblies is limited by the former's cylindrical structure versus the latter's planar buildup. Nowadays, planar heat pipes are also available, but they are still fabricated as an individual item, based on the same kind of metalworking processes as used for tubular heat pipes, like metal forming and various types of welding. This requires dedicated, high-energy tooling and machinery that do not offer a high level of flexibility. Some variants are even based on originally cylindrical heat pipes, flattened to obtain an oval section which can be arranged and bonded between two metal layers. This requires an even more comprehensive array of manufacturing processes, none of which are part of a regular PCB manufacturing process. Therefore, it may not be a really cost effective solution.

In addition, the linear shape of tubular heat pipes does not allow for a flexible layout of heat dissipating components onto the PCB. As a consequence, the entire assembly of components and printing of circuits may be strongly impacted by the cooling system.

In an attempt to better integrate a cooling system into a PCB, planar heat pipes have been introduced in the past. Unfortunately they were manufactured as individual items, based on processes very similar to those used for tubular heat pipes described above. Therefore, these solutions may not be cost effective either and may not offer a higher level of flexibility.

The present invention aims to provide an apparatus that may be used to provide a cost effective and flexible solution to the problems mentioned above while presenting similar thermal performances.

According to its main aspect, the present invention provides a planar heat pipe for cooling. In its most basic form, it includes two panels that are both metal clad on one side, at least one of the panels being grooved on its metal clad side. The panels are assembled with their metal clad sides oriented face-to-face to form a sealed cavity, which is partly filled with a fluid. The fluid circulates by capillary action along the grooves towards zones exposed to heat where it vaporizes. Vapour may circulate back by pressure gradient effect through the cavity towards zones not exposed to heat where it condenses. In a mode of implementation, the heat pipe may be embedded in a circuit board formed by the panels for inherent cooling of heat-dissipating components.

For example, the plating metal may be copper and the panels may be made from an organic material, a composite or a ceramic material.

The grooves may be etched or plated in/onto the metal clad layers.

Sealing of the cavity may be ensured laterally by use of a low-permeable crystalline material as an adhesive to assemble both panels or by a metallized trench.

The fluid may simply be water or any other fluid commonly used in heat pipes.

A septum-topped aperture in one of the panels may enable evacuation of air and subsequent injection of the fluid into the cavity with a syringe.

In another of its aspects, the present invention provides a circuit board for cooling of heat-dissipating components. It includes two panels that are both metal clad on one side, at least one of the panels being grooved on its metal clad side. The panels are assembled by their metal clad sides to form a sealed cavity. The cavity is partly filled with a fluid. The fluid circulates by capillary action along the grooves towards zones exposed to heat conveyed in through the panels preferably by thermal vias and where fluid vaporizes.

Vapour may circulate back by pressure gradient effect through the cavity towards zones where heat is conveyed out through the panels preferably by thermal vias and where vapour condenses.

The outer surfaces of the two panels may later be patterned with printed wiring and assembled with electronic components, thus integrating electronic and cooling functions into one product.

Thus, key advantage provided by the present invention in any of its aspects is that it is based on most standard processes of multilayer PCB fabrication such as laminating, selective metal plating and etching. Therefore, it is a highly cost effective solution. Furthermore, the invention provides a very flexible design solution enabling to adapt the cooling paths to the PCB layout, especially to the higher heat dissipation locations. Not requiring any supplementary materials, it is even considerably lighter than a tubular heat pipe based solution. Implemented as enhancement of a computer aided engineering tool, heat pipe cooling cavities could be designed concurrently with the layout of components placement and printing of circuits, ensuring optimised thermal management. This enables multilayer PCB assemblies, which are high density electronic devices, to benefit the most from the integrated heatpipe cooling function.

Figure 2:
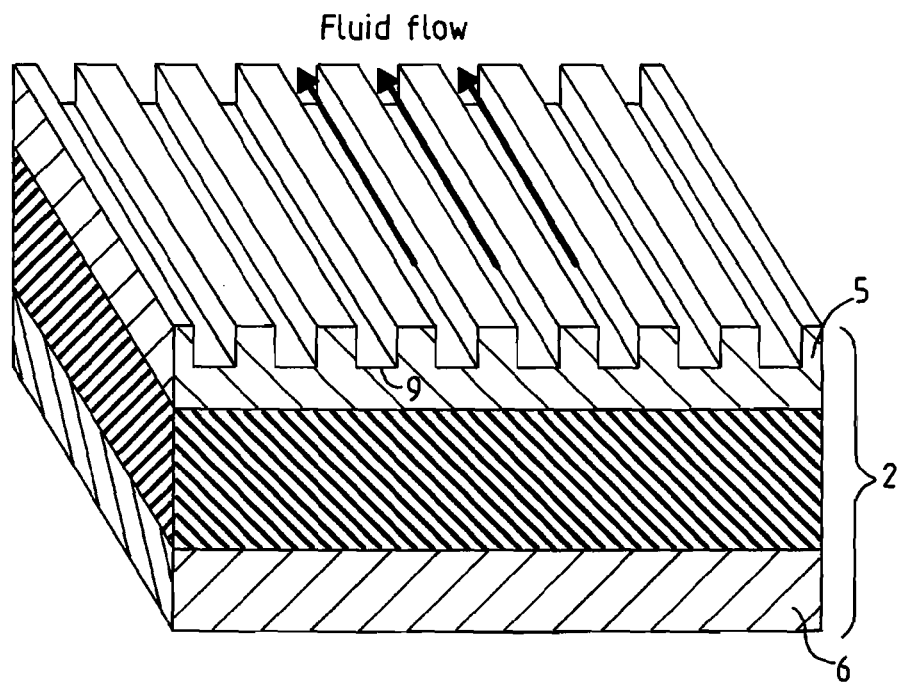
Figure 3:
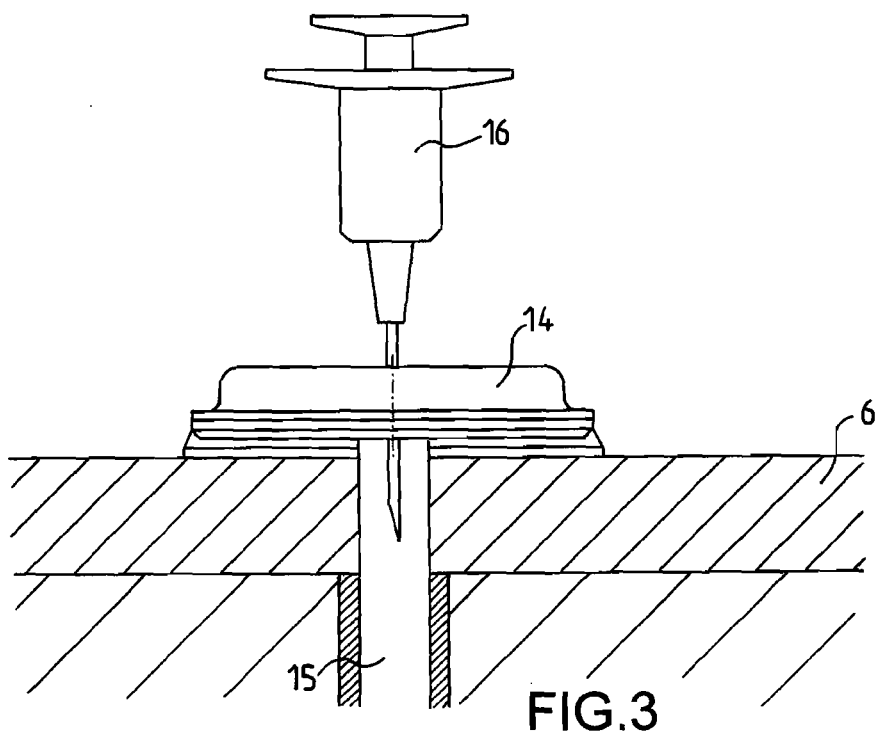

A non-limiting example of the invention is described below with reference to the accompanying drawings in which:

FIG. 1 schematically illustrates an example of a printed circuit board as an embodiment of the invention, FIG. 2 schematically focuses on grooves etched in a copper layer of a PCB laminate according to the invention, FIG. 3 schematically focuses on a method to fill a heat pipe cavity according to the invention with cooling fluid.

In the figures, like reference signs are assigned to like items.

FIG. 1 schematically illustrates an example of a printed circuit board as an embodiment of the invention.

It includes a PCB metal-clad laminate 1 with metal layers 3 and 4 on each of its sides and a PCB metal-clad laminate 2 with metal layers 5 and 6 on each of its sides. In the example of the figure, clad metal is copper and PCB laminates are made from an organic material, for example a glass-fibre reinforced polymeric material such as the well-known FR-4. But alternative dielectric materials could be used, ceramic materials for example, plated with different metals in different thicknesses.

PCB laminates 1 and 2 are bonded all together excluding the heat pipe areas through the use of an adhesive dielectric film 7. The thickness of the adhesive film 7 forms a cavity 8. The height of cavity 8 may be adapted by adding one or more filler layers. Within the whole of the cavity 8, parallel grooves 9 are preferably etched in the copper layer 4 of PCB laminate 1 and in the copper layer 5 of PCB laminate 2, prior to bonding laminates 1 and 2.

The cavity 8 contains an underpressure and a fluid 10, for example water. Air has been evacuated from—and water has been injected into the cavity 8 through a septum 14 assembled on top of a metallized hole 15 drilled right through the PCB laminate 2. A septum is a device ensuring hermeticity while enabling evacuation of air and introduction of a fluid with a syringe. Its use is described in detail in FIG. 3 below. To avoid loss of cooling performance, the filling system should be located as far as possible from any heat source. In any case, both layout of the cooling cavity 8 and location of the hole 15 must be considered as part of the design phase of the PCB, concurrently with the assembly of components and printing of circuits. Computer aided engineering tools could even manage complex constraints resulting from multi-layered PCBs, which can stack up to 40 layers or more, each layer including printed circuits. These tools would enable to design the optimal cooling cavity for each PCB laminate. Possibly, a best cooling cavity for a given PCB design may not follow a straight path and some of the cavities may have to be filled by a hole running right through several PCB laminates.

By capillary action, each groove is filled with water. The amount of water injected must equal the volume of the combined grooves. Indeed, a larger amount of water would prevent vapour from efficiently circulating in the cavity 8. In the example of the figure, a metallized trench 11 running right around the sides of cavity 8 ensures lateral sealing of the cavity 8. The trench 11 prevents fluid 10 from gradually permeating through the adhesive dielectric film 7. Preferably, crystalline thermoplastic materials could also be used instead of the adhesive dielectric film 7, for example liquid crystalline polymer well-known as LCP or syndiotactic polystyrene well-known as SPS. Thanks to the extremely low permeability for moisture of these materials, there would be no need for a metallized trench to laterally seal the cavity 8.

In operation, the component 13 dissipates heat through PCB laminate 1, vaporizing water that is nested in the grooves in the vicinity of the component 13. As the laminate-itself is a relatively poor thermal conductor, heat transportation through the PCB laminate 1 to the heat pipe structure is assisted by use of so-called thermal vias 12. For example, the thermal vias 12 are holes in PCB laminate 1 that have been filled with metal. Vapour moves towards the cooler side of the cavity 8 where pressure is lower because no heat is applied. There, vapour releases heat back into the PCB and subsequently to the ambient environment or, for example, a heat sink structure. Therefore it condenses. Heat transportation through the PCB laminate 1 from the heat pipe structure is assisted by use of thermal vias 17, for example holes in PCB laminates 1 and 2 filled with metal. At the same time, emptied grooves that contained water that vaporized are replenished by capillary action. On the one hand, the height of the heat pipe cavity 8 needs to be kept as small as possible to keep the overall PCB thickness as thin as possible. On the other hand, the cavity height needs to be large enough to allow adequate vapour flow inside. In the example of the figure, the height of the heat pipe cavity 8 is around 1 millimetre.

It is to be understood that variations to the example described in FIG. 1, such as would be apparent to the skilled addressee, may be made without departing from the scope of the present invention.

FIG. 2 schematically focuses on grooves etched in a copper layer of a PCB laminate according to the invention.

By a view in perspective, it zooms in on some of the parallel grooves 9 etched in PCB laminate 2 of the preceding example. In the case that thickness of the copper layer 5 was not to allow etching, a plating process could possibly be considered instead of etching to form the grooves. Capillary action enables water to easily circulate along the flat and parallel grooves 9 from the condensation zone of the cavity 8 to its vaporization zone. As sketched on the figure, fluid follows the course of the grooves, flowing in their depths. Efficiency of capillary action depends on the width-height ratio of the grooves. In the example of the figure, the grooves are 80 microns high and wide.

In the example of the figures, both PCB laminates 1 and 2 have been grooved to enable capillary action. But only one could have been grooved, thus requiring a smaller amount of cooling fluid and a smaller vapour cavity, but also providing a less efficient cooling functionality.

It is to be understood that variations to the example described in FIG. 2, such as would be apparent to the skilled addressee, may be made without departing from the scope of the present invention.

FIG. 3 schematically focuses on a method to fill a heat pipe cavity according to the invention with cooling fluid.

In the example of the figure, filling is performed by use of the septum 14, which is a disc-shaped seal made from an elastomeric material, typically silicone. It is encased in metal, apart from a small aperture to allow insertion of a syringe. This assembly is soldered onto the copper layer 3 of the PCB laminate 1. The septum 14 is a key to a simple and workable solution for filling and sealing the embedded heat pipe cavity 8 with a syringe 16. In a first step, the hollowed needle of the syringe 16 is introduced through the septum 14 to conveniently establish internal vacuum in the cavity 8. Vacuum facilitates later introduction of a fluid within the cavity 8 and facilitates its vaporization. As the needle is removed, the elastomeric seal of the septum 14 re-establishes itself, thus providing airtightness. In a second step, the hollowed needle of the syringe 16 is introduced through the septum 14 to inject water in the cavity 8. Once again, as the needle is removed the elastomeric seal of the septum 14 provides immediate airtightness and fluid sealing. For long-term hermeticity, the top of the septum 14 can be permanently sealed by a drop of solder.

It is to be understood that variations to the example described in FIG. 3, such as would be apparent to the skilled addressee, may be made without departing from the scope of the present invention.

The invention claimed is:

1. A circuit board for cooling of heat-dissipating components assembled thereon, including at least two panels at least one of which is populated with heat-dissipating components, both panels being metal clad on a side, at least one of the panels being formed from a printed circuit board laminate and comprising a plurality of grooves on its metal clad side, the panels being bonded together by an adhesive layer with their metal clad sides oriented face to face so as to form a circuit board containing a sealed cavity having a height defined by a thickness of the adhesive layer and the separation of the metal clad sides, the cavity being partly filled with a fluid, the fluid circulating by capillary action along the grooves towards zones exposed to heat where the fluid vaporizes.

2. A circuit board according to claim 1, wherein vapour circulates back by pressure gradient effect through the cavity towards zones not exposed to heat where it condenses.

3. A circuit board according to claim 1, wherein the plating metal is copper.

4. A circuit board according to claim 1, wherein the panels are made from an organic material.

5. A circuit board according to claim 1, wherein the panels are made from a composite material.

6. A circuit board according to claim 1, wherein the panels are made from a ceramic material.

7. A circuit board according to claim 1, wherein the grooves are etched.

8. A circuit board according to claim 1, wherein the grooves are plated.

9. A circuit board according to claim 1, wherein sealing of the cavity is ensured laterally by use of a crystalline material as an adhesive to assemble both panels.

10. A circuit board according to claim 1, wherein a metallized trench ensures sealing of the cavity laterally.

11. A circuit board according to claim 1, wherein the fluid is water.

12. A circuit board according to claim 1, wherein a septum-topped aperture in one of the panels enables injection of the fluid into the cavity with a syringe.

* * * * *